(12) United States Patent
Ohmi et al.

(10) Patent No.: US 6,423,178 B1
(45) Date of Patent: Jul. 23, 2002

(54) APPARATUS FOR PLASMA PROCESS

(75) Inventors: Tadahiro Ohmi; Masaki Hirayama, both of Sendai (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/679,062

(22) Filed: Oct. 5, 2000

Related U.S. Application Data

(63) Continuation of application No. PCT/JP00/01293, filed on Mar. 3, 2000.

(30) Foreign Application Priority Data

Mar. 5, 1999 (JP) .......................................... 11-103037

(51) Int. Cl.[7] .......................... H05H 1/00; C23C 16/00
(52) U.S. Cl. ........................... 156/345.53; 156/345.51; 156/345.52; 118/728; 118/724
(58) Field of Search ................. 156/345.51, 345.52, 156/345.53; 118/728, 724, 723 E, 723 F, 723 MW

(56) References Cited

U.S. PATENT DOCUMENTS

| | | | |
|---|---|---|---|
| 4,997,677 A | * 3/1991 | Wang et al. | 427/248.1 |
| 5,625,526 A | 4/1997 | Watanabe et al. | |
| 5,688,331 A | * 11/1997 | Aruga et al. | 118/725 |
| 5,948,283 A | * 9/1999 | Grosshart | 216/67 |

FOREIGN PATENT DOCUMENTS

| | | | | |
|---|---|---|---|---|
| JP | 2-42721 | 2/1990 | | |
| JP | 5-121333 A | * 5/1993 | ......... | H01L/21/205 |
| JP | 5-121333 | 5/1993 | | |
| JP | 6-346256 | 12/1994 | | |
| JP | 2000-150752 A | * 5/2000 | ......... | H01L/23/473 |

* cited by examiner

Primary Examiner—Gregory Mills
Assistant Examiner—Parviz Hassanzadeh
(74) Attorney, Agent, or Firm—Pillsbury Winthrop LLP

(57) ABSTRACT

A plasma processing apparatus that excites plasma in a container and processes an object in the plasma. This plasma processing apparatus includes: a gas supply system that supplies a process gas required for exciting the plasma; an exhaustion system that exhausts the process gas and evacuates the container; and a conductive stage on which the object to be processed is placed, the conductive stage being placed in the container. In this plasma processing apparatus, a DC voltage or high-frequency power is applied to the conductive stage; and a cooling passage for cooling the object to be processed is disposed in the stage, the cooling passage being made of a material having a high heat conductivity so as to transmit heat of the stage to the refrigerant, and a high electrical insulating strength so as not to transmit the DC voltage or high-frequency power applied to the stage to the refrigerant.

6 Claims, 4 Drawing Sheets

APPARATUS FOR PLASMA PROCESS

This application is a continuation of International Ser. No. PCT/JP00/01293 filed Mar. 3, 2000.

TECHNICAL FIELD

The present invention relates to a plasma processing apparatus that performs plasma processing, such as film forming or dry etching, on a substrate to be processed.

BACKGROUND ART

In recent years, there has been an increasing demand for high-speed plasma processing apparatuses that perform excellent film formation and dry etching at a high speed. Also, there has been a demand for smaller plasma processing apparatuses that require a smaller area, and less initial investment and operation cost.

In a plasma dry etching apparatus, in order to improve the anisotropy of the etching rate and to prevent burning of an organic resist as an etching mask, the heat caused by the plasma irradiation onto the object to be processed is removed by cooling down the stage by means of a refrigerant. In a plasma film forming apparatus, a cooling operation is also necessary if the object to be processed or the thin film has little heat resistance.

Particularly, in semiconductor production, to increase the productivity, the process speed is increased using high-density plasma, and the size of each silicon substrate is enlarged from a diameter of 200 mm to 300 mm so as to increase the number of chips obtained from one substrate. In this manner, the production cost is reduced, and the productivity is increased. However, as the plasma has higher density and the substrate has a larger size, the quantity of heat to be removed per unit time becomes greater. As a result, a larger cooling device is required. When the temperature distribution of the substrate is made uniform, the temperature difference between the inlet and the outlet for the refrigerant needs to be smaller. In such a case, it is necessary to circulate the refrigerant at a very high speed. As a result, a larger circulating device is required. In general, a chiller provided with a cooling mechanism and a circulating mechanism is used.

The stage, on which the object to be processed is placed, comprises an electrostatic chuck mechanism for tightly adhering the object to be processed to the stage, a high-frequency and DC voltage electrode mechanism for generating plasma or controlling the ion irradiation energy from the plasma, a mechanism for filling a gap between the object to be processed and the stage with helium gas so as to improve the heat conductivity between the object to be processed and the stage, and a temperature monitor mechanism for monitoring the temperatures of the object to be processed and the stage.

Conventionally, with the stage to which a DC or high-frequency voltage is applied, an inactive fluoride liquid having a low dielectric constant and low conductivity is used as a refrigerant so as to provide high electrical insulation.

However, the refrigerant used in the prior art has a small specific heat and a low conductivity, and thus is not capable of absorbing much heat. Therefore, the refrigerant is cooled down to −20°C. or lower by means of a chiller, so that the temperature difference between the refrigerant and the stage becomes greater. With such a refrigerant having a low temperature, heat insulation becomes complicated, because of a long supply pipe for the refrigerant. Furthermore, since such a refrigerant is expensive, a large amount of it makes the entire production cost too high. Therefore, a relatively small refrigerant chiller is normally disposed in the vicinity of a conventional plasma processing apparatus.

DISCLOSURE OF THE INVENTION

An object of the present invention is to provide a plasma processing apparatus that includes a small and inexpensive stage cooling mechanism.

The above object of the present invention is achieved by a plasma processing apparatus that excites plasma in a container and processes an object in the plasma. This plasma processing apparatus includes: a gas supply system that supplies a process gas required for exciting the plasma; an exhaustion system that exhausts the process gas and evacuates the container; and a conductive stage on which the object to be processed is placed, the conductive stage being placed in the container. In this plasma processing apparatus, a DC voltage or high-frequency power is applied to the conductive stage; and a cooling passage for cooling the object to be processed is disposed in the stage. The cooling passage is made of a material having a high heat conductivity so as to transmit heat of the stage to a refrigerant, and a high electrical insulating strength so as not to transmit the DC voltage or high-frequency power applied to the stage to the refrigerant.

BEST MODE FOR CARRYING OUT THE INVENTION

The following is a description of embodiments of the present invention, with reference to FIGS. 1 to 4.

Figure 1:
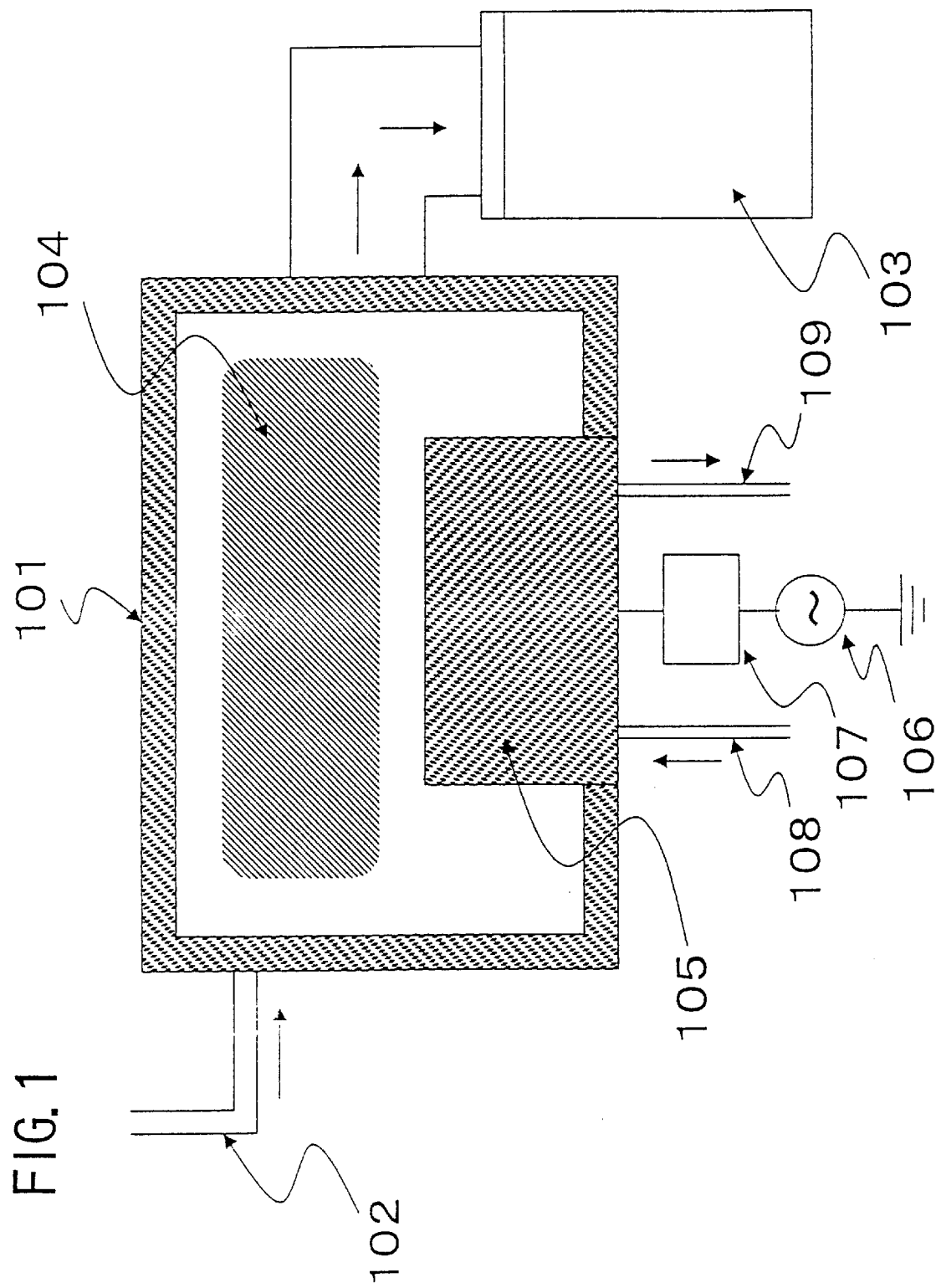
FIG. 1 is a schematic sectional view of one embodiment of a plasma processing apparatus of the present invention.

FIG. 1 shows a plasma processing apparatus of one embodiment of the present invention. This plasma processing apparatus performs dry etching on a silicon oxide film formed on a silicon substrate having a diameter of 20 mm. In this plasma processing apparatus, plasma is excited by a high-frequency power applied to a substrate stage 105.

Reference numeral 101 indicates a container main body for plasma processing. The container main body 101 supplies a process gas necessary to excite plasma 104 by means of a gas supply system 102. The process gas and reaction by-product gas are discharged by an exhausting system 103. At this point, the container main body 101 is evacuated, if necessary. A high-frequency power is applied to the stage 105, on which an object to be processed is placed, by a 13.58 MHz power source 106 and a matching box 107, so that the plasma 104 is excited. An inlet port 108 and an output port 109 for refrigerant are disposed below the stage 105.

Figure 2:
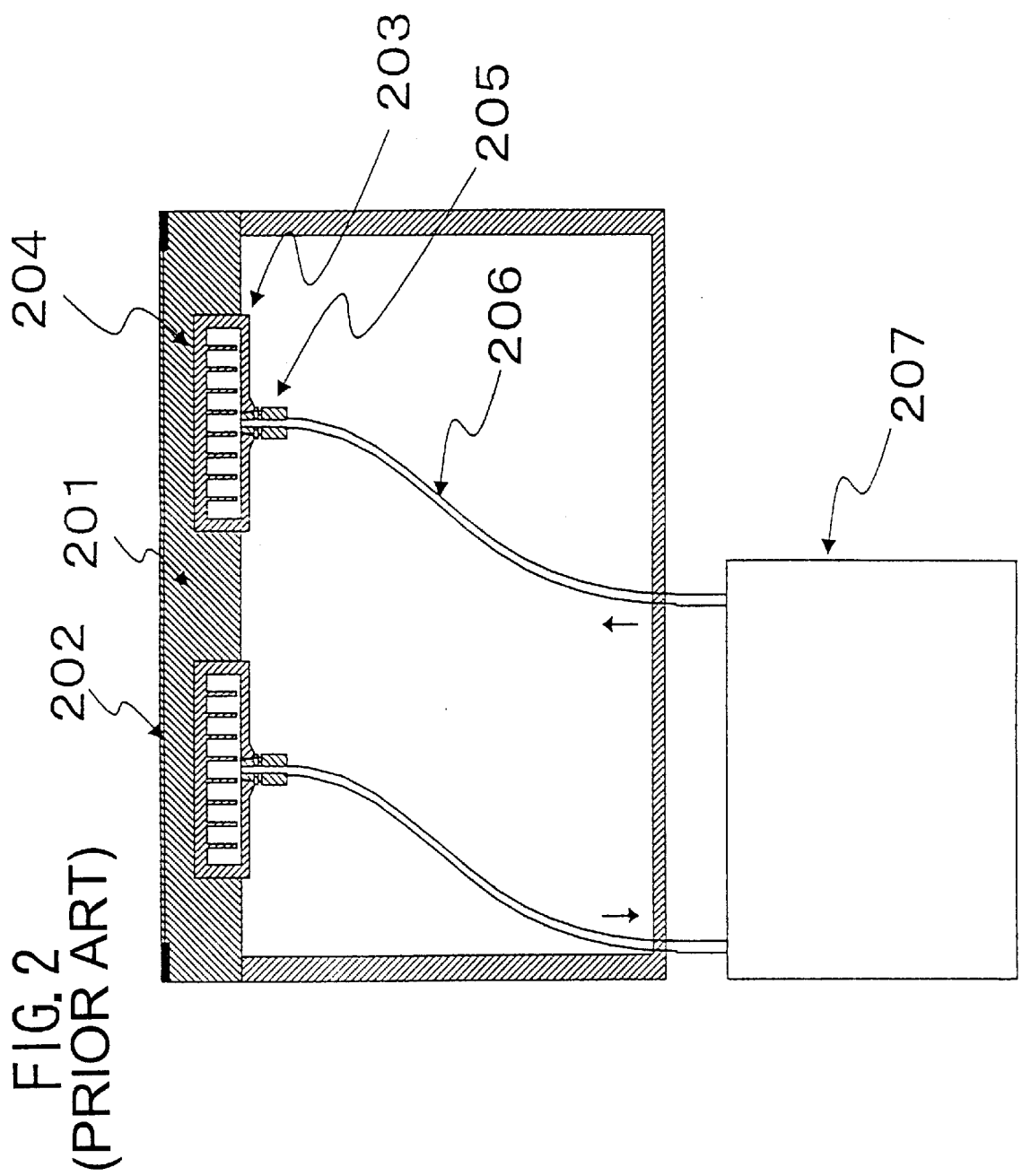
FIG. 2 is a schematic sectional view of a cooling mechanism of a stage on which an object to be processed by a conventional plasma processing apparatus is placed.

FIG. 2 shows a cooling mechanism of a conventional substrate stage. In this figure, reference 10 numeral 201 indicates a stage main body that is made of a conductor having excellent heat conductivity, such as copper or aluminum. A DC voltage or high-frequency power is applied to the stage main body 201. Reference numeral 203 indicates a refrigerant passage that is integrally formed with the main body 201 or is made of a conductor having an excellent heat conductivity so that the refrigerant passage 203 is fixed to the main body 201 by brazing 204 or screws. The refrigerant passage 203 is connected to a chiller 207 via an insulating tube 206. The chiller 207 performs temperature control and circulation control on the refrigerant. To avoid leakage of the DC voltage or high-frequency power applied to the stage main body 201, an insulating refrigerant should be employed.

Table 1 shows the characteristics of water and typical refrigerants used in the cooling mechanism. The typical refrigerants include Fluorinert (produced by Minnesota Mining and Manufacturing Company Corporation) and Galden (produced by Ausimont S.P.A. Corporation). These refrigerants are inactive fluoride liquids and insulating materials. Compared with water, the specific heat and heat conductivity of each of these refrigerants are smaller. Therefore, in order to improve the cooling efficiency of the stage main body 201, it is necessary to cool the refrigerants to a very low temperature, lower than 10 or 20° C. below the freezing point.

Figure 3:
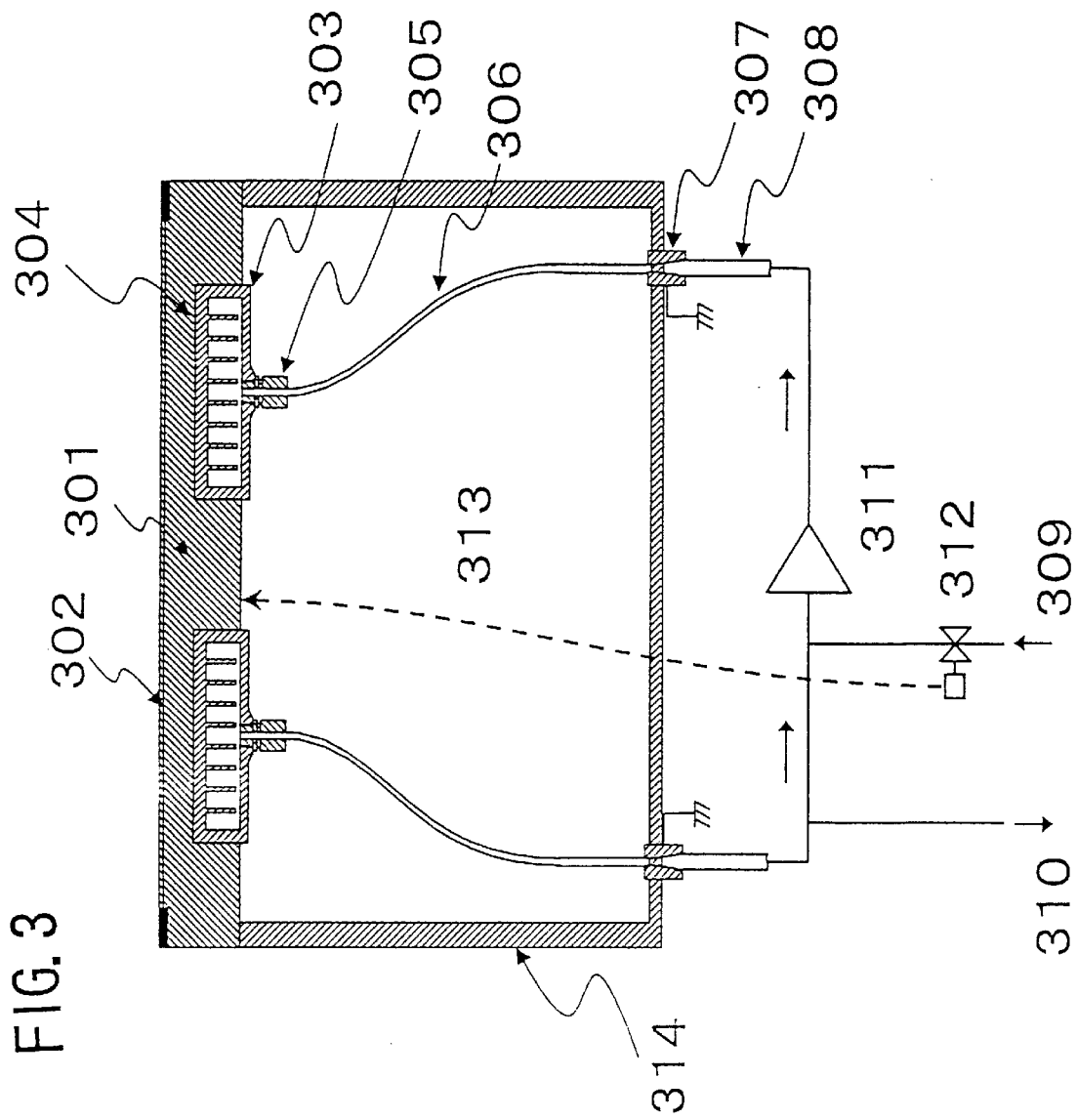
FIG. 3 is a schematic sectional view of a cooling mechanism of a stage on which an object to be processed by the plasma processing apparatus of the present invention is placed.

Meanwhile, FIG. 3 shows the stage cooling mechanism of the present invention. For a refrigerant, water at 5 to 10° C. is used. As shown in Table 1, since water has a larger specific heat and heat conductivity than the inactive fluoride liquids, a temperature in the range of 5 to 10° C. is sufficient. The DC voltage or high-frequency power is not transmitted to the water passage.

TABLE 1

| re-frig-erant | specific heat (J/g · K) | heat conduc-tivity (W/n · K) | di-electric constant | specific resistance (Ω cm) | Freez-ing point (° C.) | boiling point (° C.) |
|---|---|---|---|---|---|---|
| water | 4.2 | 0.55 | 80 | | 0 | 100 |
| Fluor-inert | 1.05 | 0.063 | 1.9 | $3 \times 10^{15}$ | −100 to −25 | 30 to 215 |
| Galden | 0.966 | 0.071 | 2.1 | $1 \times 10^{15}$ | <−110 to −66 | 70 to 270 |

Reference numeral 301 indicates the stage main body, which is made of a conductor having excellent heat conductivity, such as copper or aluminum. A DC voltage or high-frequency power is applied to this stage main body. Reference numeral 303 indicates a refrigerant passage, and is made of aluminum nitride ceramics that is an electrically insulating material having excellent heat conductivity. This refrigerant passage 303 is fixed to the stage main body 301 by a brazing member 304. A perfluoroalkoxy (PFA) tube 306 is connected to the refrigerant passage 303 by a coupler 305 made of PFA, which is an electrically insulating material. The PFA tube 306 is connected to a stainless coupler 307 on the bottom surface of a cover 314 below the stage main body 301, so as to ground the PFA tube 306. An inlet part 308 for the refrigerant is disposed below the stainless steel coupler 307. Circulation of cooling water is initiated by a pump 311. If a temperature monitor 313 for the stage detects a temperature higher than a predetermined set temperature, cooling water at 5 to 10° C. is introduced by a fluid rate controller 312 through a cooling water inlet 309, and the same amount of water as the introduced cooling water is discharged through an outlet 310. The cooling water inlet 309 and the outlet 310 are connected to a device cooling water line that circulates in a clean room.

If a high-frequency power is applied to the stage main body 301, the high-frequency power is used for exciting plasma. It is necessary to maximize the resistance between the stage main body 301 and the grounded portion 307 so as to prevent loss at the tube 306 therebetween. Also, in order to avoid bubbles generated due to electrolysis of the water, it is necessary to lengthen the tube so as to reduce the electric field strength applied to the water. If the tube 306 is made thinner and longer than necessary, pressure loss of the cooling water will become large. Therefore, in the device of the present invention, the tube 306 has an outer diameter of ¼ inches (approximately 6.35 mm) and a length of 30 cm.

The size of the tube 306 can be determined depending on the magnitude of the high-frequency power applied to the stage main body 301.

The connecting portion 304 between the stage main body 301 and the refrigerant passage 303 is not limited to the brazing member, but mechanical contact using screws, for instance, can suffice for the same function. In such a case, grease having excellent heat conductivity applied to the connecting portion can surely conduct the heat from the stage main body 301 to the refrigerant passage 303.

The refrigerant passage 303 may be made of a metallic material such as copper or aluminum, and an aluminum nitride ceramics member may be attached to the surface of the refrigerant passage 303. Alternatively, the surface of the refrigerant passage 303 may be covered with aluminum nitride ceramics.

Also, the method of circulating the cooling water is not limited to the above-mentioned method, but it is possible to dispose a chiller in the vicinity of the device. In such a case, because of a high cooling temperature compared with an inactive fluoride medium, the chiller can be made smaller.

It should be noted that the cooling water used in this embodiment is preferably reducing water so as to prevent corrosion of the cooling water supply equipment. The reducing water can be obtained by dissolving hydrogen gas in water by bubbling or the like. Such cooling water has a standard oxidation-reduction potential of 0 or lower, with a standard hydrogen electrode being the reference electrode.

In the following, the results of cooling the stage main body 301 during a dry etching process of a silicon oxidation film by means of the device of the present invention will be described. For the refrigerants, the water used in the present invention and Fluorinert (produced by Minnesota Mining and Manufacturing Company Corporation) for comparison were used in this experiment. The process conditions were as follows:

Substrate stage high frequency power: 13.56 MHz/1500 W

Process gas: $C_4F_8/CO/O_2/Ar=10/50/5/200$ sccm

Process pressure: 5.33 Pa (approximately 40 mTorr)

Substrate: 0.75-mm silicon substrate/1.6-μm silicon oxide film/0.8-μm photoresist (φ0.15-μm hole pattern formation)

Substrate stage temperature: adjusted to 20° C.

Refrigerant: water or inactive fluoride liquid, Fluorinert (produced by Minnesota Mining and Manufacturing Company Corporation)

Figure 4:
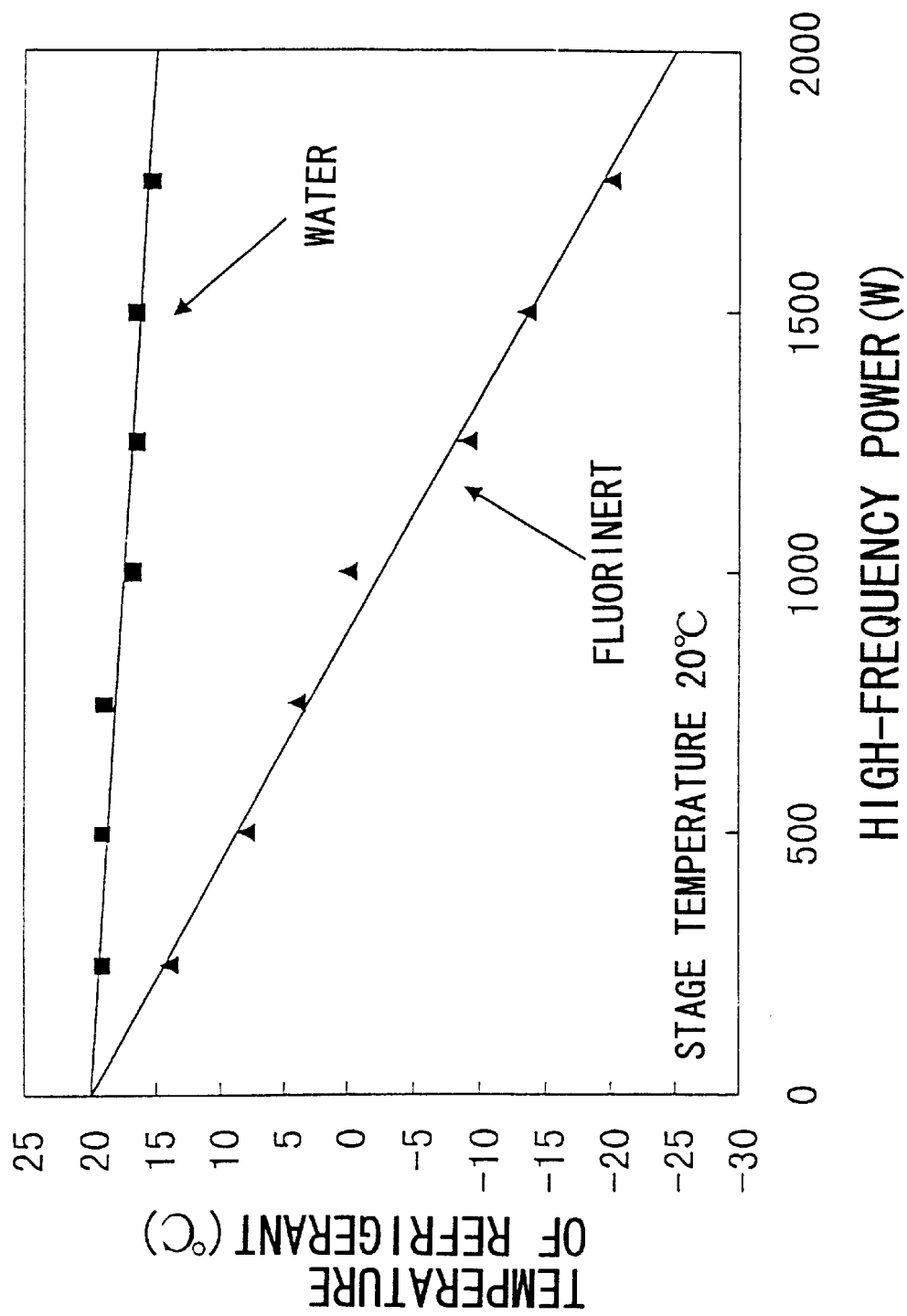
FIG. 4 is a graph showing the relationship between a high-frequency power for exciting plasma in the plasma processing apparatus of the present invention and a temperature of a cooling medium for cooling the stage on which an object to be processed is placed.

The temperature of each refrigerant required to maintain the stage main body 301 at 20° C. depends on the high-frequency power. FIG. 4 shows the measurement results of the dependency of the refrigerant temperature on the high-frequency power. When the high-frequency power is in the range of 0 to 2,000 W, Fluorinert and the water are required to have temperature ranges of −25° C. to 20° C. and 15° C. to 20° C., respectively. Since the heat conductivity of water is nine times as high as the heat conductivity of Fluorinert, the same effects can be obtained with water at a cooling temperature 1/9 as low as the cooling temperature for Fluorinert.

Further, high-frequency leakage was detected using a field-intensity meter (produced by Alpha Lab Company). As a result, it was found that, in a case where water was used and the high-frequency power was the maximum 2,000 W, the leakage was only 0.01 mW/cm$^2$ or less, which is the lowest possible value detected by the field-intensity meter.

Although the silicon substrate was used as the object to be processed, other objects such as a glass substrate may also be used.

According to the present invention, an expensive chiller and a special refrigerant having a low dielectric constant and a low electrical conductivity are not necessary. Thus, the present invention can provide a plasma processing apparatus that can be produced at a lower cost and has a smaller area.

What is claimed is:

1. A plasma processing apparatus that excites plasma in a container and processes an object in the plasma, said apparatus comprising:

a gas supply system that supplies a raw material gas required for exciting plasma;

an exhaust system that carries the raw material gas out of the container;

a conductive stage on which the object to be processed is placed, the conductive stage being placed in the container, wherein a DC or high frequency voltage is applied to the conductive stage during processing; and a cooling passage through which an electrically conductive refrigerant flows during processing for cooling the object to be processed, and is at least partially disposed in the stage, the cooling passage being made of a material having high thermal conductivity so as to transfer heat from the stage to the refrigerant, and being substantially electrically insulating, and electrically connected to a ground potential so as not to transmit the DC or high frequency voltage applied to the stage to the refrigerant, and having an extending passage connected to a coupler that is electrically connected to a ground potential at a position other than in the stage.

2. The plasma processing apparatus as claimed in claim 1, wherein at least a surface of the cooling passage in contact with the refrigerant is covered with a material containing aluminum nitride.

3. The plasma processing apparatus as claimed in claim 1 or 2, wherein the material containing aluminum nitride is aluminum nitride ceramics.

4. The plasma processing apparatus as claimed in one of claims 1 to 3, wherein the refrigerant passage is made of aluminum nitride ceramics.

5. The plasma processing apparatus as claimed in claim 1, wherein the liquid containing water as a base is pure water.

6. The plasma processing apparatus as claimed in claim 1 or 5, wherein the liquid containing water as a base is a reducing liquid having a standard oxidation-reduction potential of 0 or less, with a standard hydrogen electrode being a reference electrode.

* * * * *

UNITED STATES PATENT AND TRADEMARK OFFICE
CERTIFICATE OF CORRECTION

PATENT NO. : 6,423,178 B1
DATED : July 23, 2002
INVENTOR(S) : Ohmi et al.

It is certified that error appears in the above-identified patent and that said Letters Patent is hereby corrected as shown below:

<u>Title page,</u>
Please add the following Assignee:
-- [73] Tadahiro Ohmi, Sendai, Japan --

Signed and Sealed this

Twenty-sixth Day of August, 2003

JAMES E. ROGAN
*Director of the United States Patent and Trademark Office*